US007908532B2

(12) United States Patent
Eckelman et al.

(10) Patent No.: US 7,908,532 B2
(45) Date of Patent: Mar. 15, 2011

(54) AUTOMATED SYSTEM AND PROCESSING FOR EXPEDIENT DIAGNOSIS OF BROKEN SHIFT REGISTERS LATCH CHAINS

(75) Inventors: Joseph Eckelman, Hopewell Jct, NY (US); Donato O. Forlenza, Hopewell Junction, NY (US); Orazio P. Forlenza, Hopewell Junction, NY (US); Robert B. Gass, Pflugerville, TX (US); Phong T. Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 12/032,655

(22) Filed: Feb. 16, 2008

(65) Prior Publication Data
US 2009/0210763 A1 Aug. 20, 2009

(51) Int. Cl.
*G01R 31/28* (2006.01)
(52) U.S. Cl. ......................... 714/726; 714/734
(58) Field of Classification Search .......... 714/724, 714/726, 727, 729, 733, 734
See application file for complete search history.

(56) References Cited

U.S. PATENT DOCUMENTS

| | | | |
|---|---|---|---|
| 3,761,695 A | 9/1973 | Eichelberger | |
| 3,783,254 A | 1/1974 | Eichelberger | |
| 3,784,907 A | 1/1974 | Eichelberger | |
| 3,961,252 A | 6/1976 | Eichelberger | |
| 4,071,902 A | 1/1978 | Eichelberger et al. | |
| 4,513,418 A | 4/1985 | Bardell et al. | |
| 5,150,366 A | 9/1992 | Bardell et al. | |
| 6,243,842 B1 | 6/2001 | Slezak et al. | |
| 6,308,290 B1 | 10/2001 | Forlenza et al. | |
| 6,314,540 B1 * | 11/2001 | Huott et al. | 714/738 |
| 6,327,685 B1 | 12/2001 | Koprowski et al. | |
| 6,453,436 B1 | 9/2002 | Rizzolo et al. | |
| 6,662,324 B1 | 12/2003 | Motika et al. | |
| 6,718,286 B2 | 4/2004 | Rivin et al. | |
| 6,834,356 B1 | 12/2004 | McNeil | |

(Continued)

FOREIGN PATENT DOCUMENTS

WO WO2007010493 A2 1/2007

OTHER PUBLICATIONS

"IEEE Standard Test Access Port and Boundary-Scan Architecture," IEEE Std 1149.1-2001 , vol., no., pp. i-200, 2001 doi: 10.1109/IEEESTD.2001.92950.*
Yu Huang; Ruifeng Guo; Wu-Tung Cheng; Li, J.C.-M.; , "Survey of Scan Chain Diagnosis," Design & Test of Computers, IEEE , vol. 25, No. 3, pp. 240-248, May-Jun. 2008 doi: 10.1109/MDT.2008.83.*

(Continued)

*Primary Examiner* — Cynthia Britt
(74) *Attorney, Agent, or Firm* — William A. Kinnaman, Jr.

(57) ABSTRACT

This invention involves the use of the JTAG functional test patterns and exercisors to solve the problem of diagnosing broken scan chains in either a serial or a lateral broadside insertion manner across all latch system ports and to analyze the response data efficiently for the purpose of readily identifying switching and non-switching latches with the next to last non-switching latch being the point of the break within a defective scan chain(s). This comprehensive latch perturbation, in conjunction with iterative diagnostic algorithms is used to identify and to pinpoint the defective location in such a broken scan chain(s). This JTAG Functional test function and the JTAG test patterns ultimately derived therefrom, can take on different forms and origins, some external to a product and some internal to a product.

20 Claims, 7 Drawing Sheets

U.S. PATENT DOCUMENTS

| | | | |
|---|---|---|---|
| 6,918,057 | B1 | 7/2005 | Brophy et al. |
| 6,961,886 | B2 | 11/2005 | Motika et al. |
| 6,968,489 | B2 | 11/2005 | Motika et al. |
| 7,010,735 | B2 | 3/2006 | Motika et al. |
| 7,017,095 | B2 * | 3/2006 | Forlenza et al. ............... 714/738 |
| 7,107,502 | B2 | 9/2006 | Burdine |
| 7,225,374 | B2 * | 5/2007 | Burdine et al. ............... 714/726 |
| 7,234,090 | B2 | 6/2007 | Blasi et al. |
| 7,661,050 | B2 | 2/2010 | Van Huben et al. |
| 2002/0018380 | A1 | 2/2002 | Shinmori |
| 2005/0097518 | A1 | 5/2005 | Larson et al. |
| 2005/0229057 | A1 * | 10/2005 | Anderson et al. ............... 714/726 |
| 2005/0289421 | A1 | 12/2005 | Obermeir et al. |
| 2007/0011523 | A1 * | 1/2007 | Burdine et al. ............... 714/726 |

OTHER PUBLICATIONS

Ruifeng Guo; Venkataraman, S.; , "A technique for fault diagnosis of defects in scan chains," Test Conference, 2001. Proceedings. International , vol., no., pp. 268-277, 2001 doi: 10.1109/TEST.2001.966642.*

Ruifeng Guo; Venkataraman, S.; , "An algorithmic technique for diagnosis of faulty scan chains," Computer-Aided Design of Integrated Circuits and Systems, IEEE Transactions on , vol. 25, No. 9, pp. 1861-1868, Sep. 2006 doi: 10.1109/TCAD.2005.858267.*

Article by W. V. Huott et al. entitled "Advanced Microprocessor Test Strategy and Methodology", IBM Journal of Research and Development, vol. 41, No. 4/4, Jul./Sep. 1997, pp. 661-627.

\* cited by examiner

→ A & B ($C_2$) CLOCK SCANS (SERIAL)
----→ $C_1$ CLOCK (LATERAL BROADSIDE) SCANS IN PARALLEL

| A. Example | ... 0000*01*10100111010100010101000101101 ... |
|---|---|
| B. Run 1 | ... 00000*01*1010011101010001010100010110 ... |
| C. Run 2 | ... 0000*01*010000101010111111010010000 ... |
| D. Run 3 | ... 000*01*01010000101010100000000000001 ... |
| E. Run 4 | ... 000000*01*010001000000000000111101010 ... |

FIG. 6

AUTOMATED SYSTEM AND PROCESSING FOR EXPEDIENT DIAGNOSIS OF BROKEN SHIFT REGISTERS LATCH CHAINS

CROSS-REFERENCE TO RELATED APPLICATIONS

This application contains subject matter related to the subject matter of the following patent commonly assigned to International Business Machines Corporation of Armonk, N.Y., comprising U.S. Pat. No. 7,661,050, of Van Huben et al entitled "Method And System for Formal Verification of Partial Good Self Test Fencing Structures."

Other related applications include U.S. published Patent application No. 2005/0229057; Ser. No. 10/821,160 published 13 Oct. 2005; issued as U.S. Pat. No. 7,395,469 of Anderson et al. entitled "Method, Apparatus, and Computer Program Product for Implementing Deterministic Based Broken Scan Chain Diagnostics; and U.S. Pat. No. 7,395,470 of Burdine et al. "Method, Apparatus, and Computer Program Product for Diagnosing a Scan Chain Failure Employing Fuses Coupled to the Scan Chain".

Related commonly assigned U.S. patents include U.S. Pat. No. 3,761,695 of Eichelberger for "Method of Level Sensitive Testing a Functional Logic System"; U.S. Pat. No. 4,071,902 of Eichelberger et al. entitled "Reduced Overhead for Clock Testing in a Level System Scan Design (LSSD) System"; U.S. Pat. No. 5,150,366 of Bardell et al. entitled "Reduced Delay Circuits for Shift Register Latch Scan Strings"; U.S. Pat. No. 6,308,290 of Forlenza et al. entitled "Look Ahead Scan Chain Diagnostic Method"; U.S. Pat. No. 6,314,540 of Huott et al. entitled "Partitioned Pseudo-Random Logic Test for Improved Manufacturability of Semiconductor Chips"; U.S. Pat. No. 6,961,886 of Motika et al. entitled "Diagnostic Method for Structural Scan Chain Designs"; U.S. Pat. No. 6,968,489 of Motika et al. entitled "Pseudo Random Optimized Built-In Self-Test"; U.S. Pat. No. 7,010,735 of Motika et al. entitled "Stuck-At Fault Scan Chain Diagnostic Method"; U.S. Pat. No. 7,017,095 of Forlenza et al. entitled "Functional Pattern Logic Diagnostic Method"; U.S. Pat. No. 7,107,502 of Burdine entitled "Diagnostic Method for Detection of Multiple Defects in a Level Sensitive Scan Design (LSSD)"; U.S. Pat. No. 7,225,374 of Burdine al. entitled "ABIST-Assisted Detection of Scan Chain Effects"; and U.S. Pat. No. 7,234,090 of Blasi et al. entitled "Method and Apparatus for Selective Scan Chain Diagnostics." Each of the above listed applications and patents are incorporated herein by reference in its entirety.

BACKGROUND OF THE INVENTION

This invention relates to diagnosis of problems with shift register latches in scan chains in semiconductor chips, and more particularly to automated systems, processes, and programs for diagnosis of broken shift register latches in scan chains in semiconductor chips.

Currently a number of different methods exist to diagnose scan chain failures in an electronic chip. In most Integrated Circuits (IC)s today, all internal shift registers are on one of many scan chains. This allows all combinational logic to be tested completely even while an IC is in the circuit card and possibly while in a functioning system. When combined with Built-In Self-Test (BIST), the Joint Test Action Group (JTAG) scan chain enables a low overhead, completely embedded solution to testing an IC for certain static faults (short circuits, open junctions, and logic errors). The scan chain mechanism does not generally help diagnosis or testing for timing, temperature or other dynamic operational errors that may occur.

In the past Automatic Test Equipment (ATE) was used to apply the test patterns to the external inputs of an electronic Device Under Test (DUT) measuring outputs therefrom. In the past, the challenge in ATE design, and many of the emerging limitations in ATE-based testing, lay in the interface to the DUT. As that approach did not provide adequate detection of all of the internal defects of a microprocessor, direct access to the internal structures of a DUT was developed including Design-For-Test (DFT) and BIST techniques and methods. In a paper by W. V. Huott et al. entitled "Advanced Microprocessor Test Strategy And Methodology" IBM Systems Journal of Research and Development, Vol. 41, Nos. 4/5, 1997 Jul. 21, 1997, pp. 1-20 describes DFT and BIST techniques and methods in detail. The BIST approach is based on the fact that much of the content of an ATE type of electronics circuit tester is semiconductor-based, as are the products being tested. The main function of BIST is to reduce the complexity, to decrease the cost, and to reduce reliance upon external (pattern-programmed) test equipment. The BIST techniques and methods reduce cost by reducing test-cycle duration and by reducing the complexity of the test/probe setup, by minimizing the number of I/O signals that must be driven/examined under tester control.

The BIST function, which is embedded into IC chips, tests the internal functionality of the components of the IC's. BIST, which is one of the most common methods for determining the presence of defects on a chip die, is incorporated into products to be tested to perform functions that were previously performed externally of the DUTs by semiconductor-based test equipment. Thus BIST eliminates complex interfacing with the DUTs. In addition to eliminating complex interfacing, the BIST approach provides several benefits including reduction of the burden on and complexity of external testing and dynamic stressing and reduction of the cost of product interface equipment, interface boards, space transformers, and probes. Easy access is provided for testing embedded memories and other structures. Tests are run at-speed, i.e., at the system operating frequency, which provides for better coverage of delay-related defects. Also, the approach can be used after product assembly for system and field testing.

The BIST function can be divided into two major categories required to examine the various structures present on a chip die including Logic BIST (LBIST) and Array BIST (ABIST). LBIST tests logic gates, latches and clock distribution networks in the devices at-speed. ABIST tests the embedded Random Access Memory arrays (RAMs) at-speed.

Burdine al. U.S. Pat. No. 7,225,374 entitled "ABIST-Assisted Detection of Scan Chain Effects" describes an apparatus, program product and method utilizing an ABIST circuit provided on an integrated circuit device to assist in the identification and location of defects in a scan chain that is also provided on the integrated circuit device. In particular, a defect in a scan chain may be detected by applying a plurality of pattern sets to a scan chain coupled to an ABIST circuit, collecting scan out data generated as a result of the application of the plurality of pattern sets to the scan chain, and using the collected scan out data to identify a defective latch in the scan chain FIG. 1 an abstracted representation of a prior art integrated circuit comprising a Level Sensitive Scan Design (LSSD) device 100, which illustrates the structural relationship between scan chains and logic circuits according to the present invention. In FIG. 1, integrated circuit 100 includes SRL chains 105A, 105B and 105C interspersed between combinational logic 15A, 15B, 15C and 15D. The LSSD circuit 100, which incorporates one or more blocks of combinational logic 15A, 15B, 15C and 15D, which is integrated with boundary scan architecture comprising one or more sets of scan chains 14A, 14B and 14C. The LSSD device 100 includes several SRL chains SRL 30A, 30B and 30C, 30D . . . 30Y and 30Z, each of which is implemented in a L1/L2 configuration where the output of the L1 or master SRL feeds an input of a corresponding slave L2 and the L1 has two data ports (one from a combinational logic stage 15A-15C and one from the previous SRL L2 output) and may be updated by either a first scan clock (A clock) or a functional clock A.COPYRGT.clock) while the L2 or slave SRL has an output to combinational logic 105 and is updatable by a second scan clock (B clock).

The A and C clocks which are exclusive of each other are out of phase with the B clock. In FIG. 1 the SRL chain structure is essentially the same as illustrated in FIG. 2A which is described below. It should also be noted that an alternative name for an SRL chain in a set of serially coupled SRL chains is a STUMPS (Self-Test Using a Multiple Input Signature Register (MISR) and a Parallel Shift-register) channel, as will be well understood by those skilled in the art. See Motika et al. U.S. Pat. No. 6,961,886 entitled "Diagnostic Method for Structural Scan Chain Designs."

The LSSD circuit 100 illustrates the structural relationship between several scan chains and several sets of combinational logic circuits including SRL chains 14A, 14B, and 14C plus lateral broadside Primary Input (PI) lines 63A and lateral broadside Primary Output (PO) lines 64D and combinational logic blocks 15A, 15B, 15C and 15D which represent combinational logic circuits which execute various predetermined logic functions. The LSSD circuit 100 will include several stages of combinational logic and memory 15A, 15B, 15C and 15D incorporating an integrated boundary scan architecture comprising one or more sets of Shift Register Latch (SRL) scan chains 14A, 14B and 14C. While FIG. 2 illustrates three SRL chains 14A, 14B and 14C, any number of SRL chains may be utilized in a particular design. The combinational logic stages 15A, 15B, 15C and 5D comprise the logic circuits to be tested. SRL chains 14A, 14B and 14C comprise the means for stimulating and collecting test data relating to combinational logic stages 15A, 15B, 15C and 15D.

Each SRL chain 14A, 14B and 14C comprises a first SRL 30A, intermediate SRLs 30B, 30C, 30D . . . 30Y and a last SRL 30Z all coupled in series. SRL chains 14A, 14B and 14C may contain equal numbers of SRLs or different numbers of SRLs. In practice, it is common for SRL chains to contain several thousand SRLs. The SRL chains 14A-14C are serial input/output shift registers. Each SRL 30A-30Z is selectively coupled to combinational logic circuits on the input side of the next stage by a respective one of the PI vectors 64A, 64B and 64C and each SRL 30A-30C is selectively coupled by a respective one of the PO vectors 63B, 63C and 63D to different combinational logic circuits on the output side.

In particular, the combinational logic blocks 15A and 15B are interconnected via output lines 64B to scan chain latch circuits 14A and by input lines 63B therefrom. The combinational logic blocks 15B and 15C are interconnected via output lines 64B to scan chain latch circuits 14B and by input lines 63C therefrom. The combinational logic blocks 15C and 15D are interconnected via output lines 64C to scan chain latch circuits 14C and by input lines 63D therefrom. The combinational logic block 15D is adapted to provide a lateral broadside Primary Output (PO) on the lines 64D in response to $C_1$ clock pulses as described above. One or a plurality of system clocks 108 output timing signals to control timing operations of the combinational logic blocks 14A, 14B, 14C and 14D and scan the chain latches 14A, 14B, 14C and 14D and one or a plurality of scan chain clocks 107 provide timing signals to scan chain latches 14A, 14B, 14C and 14D, as will be well understood by those skilled in the art.

Alternatively the scan chain latches may be tested by loading data into them serially. In particular, in serial operation the Shift Register Input (SRI) data is supplied to the LSSD circuit 100 and is loaded into the first SRL latch 30A of the first SRL chain 14A in response to A and B clock pulses directed to the SRL chain 14A. The output on line 124 of latch 30Z of SRL chain 14A is directed to latch 30A of the SRL chain 14B. Similarly, in response to A and B clock pulses directed to the SRL chain 14B. The output on line 125 of latch 30Z of SRL chain 14B is directed to latch 30A of the SRL chain 14C. Also, in response to A and B clock pulses directed to the SRL chain 14C, the output line 126 of latch 30Z of SRL chain 14C comprises the Shift Register Output (SRO) line 126.

In typical Level Sensitive Scan Design (LSSD) circuit configurations, each of the scan chain latches 14A, 14B and 14C can be used as a pseudo-primary input and/or a pseudo-primary output of each combinational logic block 15A, 15B, 15C or 15D in addition to the PI lines 63A and PO lines 64D for the LSSD circuit 100. This enables the stimulation and observability of the device being tested or diagnosed. A problem is encountered when the scan chain does not function properly and access to the internal logic of the device is greatly reduced. This is often the case early in the technology or the product introduction cycle when yields are relatively low. In such situations, the rapid determination of the root cause is critical, but may be difficult to diagnose.

For example, when there is a stuck-at fault on scan chain 14A, for instance a stuck-at logic 1 fault, a serial input on input line 123 of logic 1 will come out of the scan chain 14A on output line 124 after a certain number of clock cycles, no matter if a serial input on input 123 of logic 0 or 1 is scanned in. From this result, it can be determined that there is a stuck-at 1 fault in the scan chain 14A, but the exact SRL 30A-30Z with the faulty condition can not be located or even isolated. While several techniques have been developed in the past to diagnose this type of failure, these techniques have produced limited success. Scan based designs are fairly common, and the scan chains represent a significant portion of the surface area of an integrated circuit. Thus, a solution which speeds the identification of faulty scan chain latches on questionable integrated circuits provides timely yield improvements, thereby insuring successful production of the design. Preferably, a scan chain fault can be diagnosed within a manageable number of logic blocks in the minimum time. This expedites isolation of further investigation using conventional physical failure analysis tools.

FIG. 2A is a schematic diagram showing a typical prior art type of circuit used in testing comprising a LSSD scan chain circuit configuration comprising a Level Sensitive Scan Design (LSSD) scan chain latch circuit 14 of the kind illustrated in commonly assigned U.S. Pat. No. 6,453,436 of Rizzolo et al entitled "Method and Apparatus for Improving Transition Fault Testability of Semiconductor Chips". The LSSD scan chain latch circuit 14 includes a plurality of Shift Register Latches (SRLs) 30A, 30B, 30C, and 30D, each of which comprises a pair of bistable latches including an L1 master latch 32 and an L2 slave latch 34. The SRL latches 30A-30D include a first $(SRL_1)$ latch 30A, a second $(SRL_2)$ latch 30B, . . . next to a $(SRL_{N-1})$ latch 30C, and a last $(SRL_N)$ latch 30D. The operational timing of a scan chain latch 14 of FIG. 1A is effected by system and scan clock signals $C_1$-CLK, A-CLK and B-CLK ($C_2$), as will be well understood by those skilled in the art.

In particular, serial loading of each L1 master latch 32 occurs upon generation of an A-CLK pulse on line 44 during which serial input data applied to each Shift Register Input (SRI) line 36 is input to the L1 master latch 32 connected thereto. Application of a B-CLK pulse on line 46 causes data to be transferred from the L1 master latch 32 of into the L2 slave latch 34 of that SRL. The continuous, alternating application of A-CLK and B-CLK clock pulse signals on respective A-CLK line 44 and B-CLK line 46 sequentially propagates a series of data signals applied to SRI line 36 of each SRL through the series of SRLs in the scan chain latch 14 to the Shift Register Output (SRO) line 40.

In summary, the L1 master latch of each the SRLs 30A-30D is connected to receive serial input of data on the respective SRI serial line 36 thereof which is transferred via L1 and L2 latches from a preceding SRL to a following SRL in response to inputs on A CLK pulse line 44 and B CLK clock pulse line 46, as will be well understood by those skilled in the art. In the serial mode of operation of the latch circuit 14, the application of a "$C_2$" (B) clock pulse on line 46 causes data to be output from the SRLs via slave latches L2 to a succeeding L1 master latch 32, or with respect to $SRL_N$ 30D, data therefrom is output on Serial Register Output (SRO) line 40.

The L1 master latches 32 of the SRLs are also adapted to receive data in lateral broadside form from Primary Input (PI) vector lines 140A in response to "$C_1$" clock pulses applied simultaneously to each of the L1 master latches. In like manner the data stored in the L2 slave latches 34 is transmitted in lateral broadside manner on output vector lines 145A to circuits therebelow. Each bit line of the primary input PI vector 140A is input to a respective parallel data line 36. As will be well understood by those skilled in the art, in the lateral broadside mode of operation the data is clocked into each SRL 30 by applying the "$C_1$" clock pulse on line 48 to each of the L1 master latches 32. Data is clocked out of each SRL 30 by applying an "A CLK" clock pulse on line 44 to the respective L2 slave latch 34. The number of SRLs 30 in an SRL latch chain 14 depends upon the width of PI vectors.

In summary, to affect a parallel load, a $C_1$-CLK clock pulse is applied to C-CLK line 48 to cause a parallel load of data via parallel data input lines 36 to each master latch L1 of SRL 30. Application of a $C_1$-CLK clock pulse to B-CLK line 46 causes a parallel output of data from each L2 slave latch to provide data on respective parallel output data lines 36 therefrom the L2 slave latch 34.

In parallel operation of the latch circuit 14, data is output broadside from the L2 slave latches on outputs 145A. In that case, each SRI line 36 functions as a parallel output data line to affect a parallel output from each of the scan chain latches 14A or 14B of FIG. 2, as described below. Patents which describe LSSD techniques include U.S. Pat. No. 3,783,254; U.S. Pat. No. 3,784,907; U.S. Pat. No. 3,961,252; U.S. Pat. No. 4,513,418; and U.S. Pat. No. 6,662,324, all of which are commonly assigned; and the subject matter of which patents is hereby incorporated by reference.

FIG. 2B shows a prior art circuit 90 including five SRL stages 14A of latches connected in series as in FIG. 2A. The circuit 90 include SRL 30A which is a first stage of the five SRL stages 14A include shift register latches 30A, 30B, 30C, 30D and 30E from ($SRL_1$ to $SRL_5$) connected in series by lines 36 as in FIG. 2A and broadside connections in parallel from the L2 latch output lines 64A which are connected to combinatorial logic elements 15B which in turn have outputs which in turn have parallel lines broadside lines 63B connected to the L1 latch inputs of a second stage 14B of five SRLs 14B (30A to 30E) from $SRL_1$ to $SRL_5$. However, in the second stage 14B the series connection line 36' from $SRL_3$ to $SRL_4$ is broken so that no serial transmission of data from latch $SRL_3$ to $SRL_4$ could be completed as the data would not flow through the broken connection, and data from lines 63B to the first three SRLs $SRL_1$, $SRL_2$, and $SRL_3$ would never reach the $SRL_4$. This illustrates the problem involved here, which is to discover the location of the type of break shown in FIG. 1B or to discover the location of a stuck latch if for example the latch $SRL_3$ or $SRL_4$ were stuck, which would be the equivalent of the break 36'.

To reduce the number of full-speed tester channels required, in accordance with the boundary-scan DFT and LBIST functions, a scannable memory element is located adjacent to each chip I/O so that signals at the chip boundaries of the DUT can be controlled and observed using scan operations and without direct contact. This boundary-scan chain is also needed for the logic BIST technique. Access to the boundary-scan chain as well as to most of the DFT and BIST circuits is made through a custom five-wire interface that is used to initialize and control the various on-chip BIST controllers and other DFT hardware during both system test and manufacturing test. A state machine within each chip, referred to as the Self-Test Control Macro (STCM), is used to control internal-test-mode signals and the sequencing of all test and system clocks while in test mode.

Instead of testing the performance of the device at full speed through the pins, an on-chip Phase-Locked Loop (PLL) multiplies the incoming tester frequency to bring it up to the operating frequency of the chip. Self-Generated Clock (SGC) circuits generate system clock sequences which exercise all portions of the chip.

One of the most common methods for determining the presence of defects on a chip die is BIST.

There are two types of BIST required to examine the various structures present on a chip die. Logic Built-In Self Test (LBIST) focuses on logic gates, latches and clock distribution networks, while ABIST exercises Random Access Memories (RAMs).

FIG. 3 is a block diagram which illustrates the main components of the prior art LBIST method which allows for discovery of defects in the DUT 10, e.g. a semiconductor chip die. FIG. 3 incorporates the main components of an embodiment of the LBIST method which allows for discovery of most defects in the DUT 10. The DUT 10 includes Internal Common Logic, (ICL) 20 which is under test. The ICL 20 includes logic gates and latches. Testing structures which reside on the DUT 10 along with the ICL 20 include a LBIST controller 21, a Pseudo Random Pattern Generator (PRPG) 22, and a Multiple-Input Signature Register (MISR) 23. These test structures reside on the DUT 10 along with the ICL 20, which includes, among other things the various the logic gates and latches comprising the cores and common logic.

The LBIST controller 21 is connected to the PRPG 22 by link 16, to the ICL 20 by control bus 18 and to the MISR by control bus 19. The PRPG 22 is connected to the serial inputs of latch chains in the ICL 20 by lines 17A, 17B and 17C which require LBIST testing. The serial outputs of the latch chains are connected by STUMPS lines 24A, 24B and 24C to the MISR 23. There are usually too many latches in the DUT 20 to be connected into one long STUMPS channel 24A, 24B or 24C, so typical MISRs 23 are constructed to handle a multitude of STUMPS channels 24A, 24B and 24C. The longer a STUMPS channel 24A, 24B or 24C, the more time it takes to scan each PRPG pattern into the latches, and subsequently scan the resulting pattern out of the latches into the MISR 23.

The LBIST controller 21 generates all necessary waveforms which are supplied to the PRPG 22 which supplies inputs into the scan latch chains in the ICL 20, initiating a functional cycle (capture cycle), and logging the captured responses out into the MISR 23. Control bus 18 is the conduit for the LBIST controller to manipulate the system and scan clocks for all the latches in the ICL 20 of the DUT 10 in order to execute the various test sequences defined in the LBIST procedure.

For simplistic chips, the internal logic 20 represents all the latches and combinatorial logic on the chip. A mismatching MISR signature results in an unusable chip which must be discarded. However, for complex chips such as that of the preferred embodiment DUT 10, it would be wasteful to discard the entire chip if a single defect is found. These chips utilize a multitude of LBIST controllers 21, PRPGs 22 and MISRs 23 to test portions of the chip separately. In some cases, a device found to have a mismatching signature can be disabled and as long as the DUT 20 is defect free, the DUT 10 can still be used in a degraded fashion.

The LBIST Controller 21 manipulates the clock distribution network of the DUT 10 repeatedly to activate the PRPG 22 to propagate the pseudo random patterns via links 17A, 17B and 17C through the ICL 20 and via STUMPS lines 24A, 24B and 24C into the MISR 23. Each pattern from the PRPG 22 results in an expected bit pattern being loaded into the MISR 23. The MISR 23 employs the same Linear Feedback Shift Register (LFSR) as the PRPG 22 to combine the incoming pattern with the current MISR value resulting in a mathematically compressed signature. The current MISR pattern is repeatedly combined with the results of each new PRPG pattern, until the final PRPG pattern is propagated. The MISR 23 compresses the accumulated responses into a code known as a signature code. Any corruption in the final signature code at the end of the test indicates a defect in a latch in the ICL 20.

This LBIST architecture comprises STUMPS (Self-Test Using MISR and parallel shift register Sequence generator) architecture. The scan latch chains in the ICL 20 which connect signals serially between the PRPG 22 and MISR 23 are defined as STUMPS channels. Upon final propagation, the MISR 23 contains an analytically predictable signature that is unique for the given internal logic of the ICL 20. When all the logic is properly fabricated without defects, the final result from the MISR 23 matches the predicted signature and the DUT 10 is deemed good. In a case in which the final MISR mismatches the predicted signature, it indicates the presence of a defect and the DUT 10 cannot be fully utilized. The control bus 19 from the LBIST Controller 21 transmits signals that manipulate the clocks for the MISR 23 to permit loading of the internal latch contents into the MISR via the STUMPS lines 24A, 24B and 24C.

The PRPG 22 is initialized with a predefined test vector or seed. A Linear Feedback Shift Register (LFSR) with an input bit that is a linear function of its previous state, as will be well understood by those skilled in the art, is employed within the PRPG 22 to recombine the PRPG bits and repeatedly generate new patterns. Analytical software is typically used to determine the required number of pattern iterations necessary to exercise all phases of the ICL 20 under test in an effort to discover any stuck faults due to open or short circuits, as well as finding AC defects due to insufficient timing margins.

Heretofore, JTAG test pattern(s) and exercisors have been employed to solve the problem of diagnosing broken scan chains in a shift register scan chains. Such diagnosis is accomplished by employing a method that generates a self-contained and exhaustive diagnostic test pattern suite (i.e. a set of closely related or interacting programs) of the JTAG test pattern suite that sensitizes and pinpoints the exact location of a defective latch within the broken scan chain. This JTAG test pattern suite consists of numerous LBIST tests, ranging from various clock sequences (1g, 2g, 3g, 4g, 5g, 6g, 7g), and different load/unload (s) (skewed unload, skewed load) to higher loop count signature intervals (4 k, 64 k, 256 k, 1 M tester loops) in a functional/system type mode.

Typically, most LSSD tests will not run after the occurrence of a scan chain break. However, if one LSSD test can be run, then most likely LBIST will also run, and LBIST will give better results faster. LBIST is a very powerful tool for diagnosing scan chain breaks because LBIST requires that the chains subdivided into smaller sections (1024 latches). This means that if LBIST can run, then after the break, the STUMPS channels will be loaded with data, and as a result, after the break, there are fewer latches to be eliminated. For this to be achieved LBIST must still run, but in some cases there is a probability that LBIST will fail to run. The fact that LBIST is a relatively small state machine on a separate ring (i.e. cyclic arrangement of data elements) means that there is a higher probability that it will run. Moreover, there is no guarantee that LBIST will find the exact location of the break in spite of the fact that the odds are improved. In fact, because JTAG operates on only one scan chain at a time, and it requires a state machine on the chip to function, makes it worse than the tester in some aspects. The dynamic and flexible environment provided by a software API/interface is employed to access the JTAG port of a chip.

VLSI testing has a constant problem with the diagnosis of the exact location of broken scan chain(s). When there is low or zero yields, the scan chain(s) are often broken so that the only opportunity to learn and diagnose the root cause of the problem is defect localization based upon scan chain failure data. Other LSSD, LBIST, ABIST, functional, DFT and Design-For-Diagnostics (DFD) test applications all assume the scan chains are operational. Hence, it is vital to have fast and efficient methods for diagnosing defects of this type and class. It is assumed herein that the LSSD scan 'A', 'B' clocks and system 'C1', 'C2' clocks are functional.

The problem of diagnosis of the location of broken scan chains is usually encountered early in the life cycle of a technology and it is critical to improving the fabrication process to achieve required manufacturing yield levels quickly. An inability to improve the technology and yield can greatly impact a program or at least severely minimize the revenue that could be realized. Rapid diagnosis to a location for Physical Failure Analysis (PFA) is needed to understand and correct the process anomalies. In these low or zero yield situations, the most common failure is often the scan chain. The LSSD Flush and Scan tests will fail when there are broken scan chain(s) on a device. In these cases, there is no operating region where the scan chain(s) are functional. Since all other tests utilize the scan chain to perform device tests, diagnostics of broken scan chain(s) with hard DC flush and scan fails is extremely limited. In view of the inexorable increase in the density of VLSI devices, the respective scan chains will continue to increase in size proportionally and thus, this problem will be exacerbated. Fault simulation/test generation, which are extremely vital tools for diagnosing combinational faults, is very inefficient and ineffective for Shift Register (SR) diagnostics. Hence, having a solution which speeds broken scan chain diagnostics on the majority of the failing devices, eventually results in timely process corrections and yield improvements.

Existing methods and approaches to this problem include dumping "megafail" data on the tester, ATPG (Automatic Test Pattern Generation) directed at each hypothetical broken latch, voltage and timing sensitive methods, IDDQ current measurements, power up/down techniques, and LSSD LBIST/ABIST engine based techniques.

The drawbacks of these known solutions include very large data volumes, requires long simulation times, not always completely reliable. Lastly, no single method is always successful. This can be attributed to the nature of the particular fault and its manifestation, complex faults, and not limited to the type of chip area that propagates to the broken latch'(es) system paths whether it originates from combinational logic or array outputs. In addition, mostly LSSD diagnostic solutions have addressed this problem and not the functional system/JTAG diagnostic test methodologies.

LBIST Design Test Methodologies

Two basic components of this LBIST structure are a LFSR and a MISR. The LFSR serves as a PRPG that provides the stimuli for the logic being tested, while the MISR is utilized to generate a unique signature representing the responses from the logic. Ideally the signature for each failing device is different from the signature of a good device after a predefined number of test cycles.

Motika et al U.S. Pat. No. 6,968,489 (cited above) describes a BIST system and indicates that deterministic pattern test methodologies have evolved mainly in support of LSSD logic and structural testing, which is today the prevailing main design and test approach. A typical testing system incorporates BIST test methodologies. This structure utilizes a LFSR which applies test vectors to shift register chains in an integrated circuit DUT. The outputs of the shift register chains are input into a MISR.

The configuration of the scan chain in the LBIST test mode is partitioned into several sub-chains of approximately the same length as shown in FIGS. 1, 2A, and 2B. These chains are loaded and unloaded serially for each LBIST test. The pseudo random data loaded in parallel into each sub-chain is supplied by the LFSR and used as test stimuli. Similarly, the state of all latches in the sub-chains are unloaded serially into the MISR forming a signature representing the compressed data. Each LBIST test cycle, in addition to the loading and unloading of the sub-chains, requires timed application of system clocks to launch the test vector from these latches through the combinational logic and capture the resulting response in the receiving latches. Since a typical system design may consist of several system clocks and various path delays, the clock test sequence and timing set-up may be applied multiple times with different clock combinations and timings. Typically, this is accomplished by an On-Product Clock Generation (OPCG) function and LBIST control. An LBIST test interval in turn consists of a relatively large number of these load/unload sequences followed by the system clock cycle. At the end of the interval the signature from the MISR is unloaded and compared to an expected signature. Several signature intervals may be applied to achieve the desired test coverage.

Application Programming Interface (API) software is employed to access the JTAG port of a chip in order to display and alter rings and scan communication registers. For complex chips such as multiple processor cores or complete systems on a chip (SOC), the prevailing LBIST technique in use today relies on obtaining a matching signature using a deterministic set of test vectors.

Linear Feedback Shift Register (LFSR)

FIG. 4 is a circuit diagram of a prior art example of LBIST architecture in which a PRPG which comprises a 61-bit LFSR 205 is provided with an input 16 from the LBIST Controller 21 with a feedback configuration. The input line 16 connects to the "0" input of a multiplexer (MPX) 48. The LFSR 20 utilizes taps 0, 14, 15, and 60 to supply inputs to an XOR 55 which is connected to the "1" input of MPX 48. To minimize data dependencies, the sixty-one outputs 50A-50N of the latches 49A-49N (with n outputs and n LFSRs in the PRPG 22 are passed through a spreading network of n XORs 52 respectively spreading before being applied on lines 54A-54N to be supplied to the logic. The spreading network minimizes latch adjacency dependencies between subsequent stages of the LFSR 205.

After stage 49, each latch stage 49A-49N of the LFSR 205 has an associated two-input XOR 52A-52N which is fed from that stage and the output of LFSR bit 0 stage on line 50 of the LFSR 205. The output of the LFSR is applied to the appropriate STUMPS channel scan input. The MISR 23 of FIG. 3 is also 61 bits long and has a feedback configuration similar to that of the PRPG. Unlike the PRPG 205, the MISR 23 has a two-input XOR between each of the latch stages, which allows for 61 bits of data from the STUMPS channel scan outputs to be clocked into the MISR 23 on each LBIST scan cycle in the process of generating the signature. The LFSR 205 incorporates the feedback configuration provided by via line 50 from the LFSR bit 0 stage on line 50 to an XOR 55. Each stage of the LFSR 22 has an associated two-input XOR 52A-52N which is fed from that stage and bit "0" on line 50A of the LFSR 22.

The PRPG scan output on line 17 of the LFSR 22 is applied to the appropriate STUMPS channel scan input. The XOR 55 feeds back signals from bit "0" PRPG bit "15" and "16" to the "1" input of multiplexer MPX 48 that supplies an input to "0" bit LFSR 49.

Although pseudorandom patterns achieve high test coverage for most scan-based designs, some areas within the design may be inherently resistant to testing with such patterns. Therefore, supplemental patterns designated as Weighted Random Patterns (WRP) are used during manufacturing test. WRP testing avoids the large test data volume that would be needed to drive conventional stored-pattern logic tests. External tester hardware is used to force individual bits in scan-based random test patterns to be statistically weighted toward a logic "1" or "0". Compared with LBIST alone, this method greatly reduces the number of random patterns needed for obtaining high test coverage, thereby greatly reducing test time.

Design-For-Test (DFT) LBIST

Referring again to FIG. 3, LBIST is used for testing during manufacturing at all package levels and for system self-test. The main LBIST components comprise a PRPG and a MISR, which are connected to chip scan chains to form the overall LBIST structure. A basic LBIST logic test sequence is used to apply test patterns. In a first step, the PRPG and MISR are initialized to a predetermined state known as a "seed." Then, the circuitry loops on the second and third steps for "n" patterns.

In the second step, scan clocks are applied to the PRPG the MISR, and the system latches so that a pseudorandom pattern is generated by the PRPG and loaded into the system latches; while simultaneously, the result of the previously applied test pattern is compressed from the system latches into the MISR. In the third step, the system clocks are applied to the system latches to test the logic paths between the latches; and test patterns are both launched and captured by the latches in the scan chains against an expected predetermined signature that was calculated during the test-pattern generation and simulation process.

There are multiple means to apply the LBIST sequence to perform different categories of logic tests. If the test is required to verify only that the logic structure between the latches is correct and has no stuck-at faults, the LBIST test can be applied with static, nontransitional patterns. The time between launch of data from one system latch and data capture in another system latch is irrelevant, so data are scanned into the latches in a nonskewed state such that the master and slave latches contain the same data. When system clocks are applied, there is no transition of data on the launching latches.

If the LBIST test is to determine not only that the logic between system latches is correct, but also that the propagation delay from one system latch to another occurs within a predetermined delay, a transition test is applied. In the transition test, data are scanned into the latches in a skewed state so that the master and slave latches potentially have different values so that the launch clock will create transitions at the latch outputs. Then precisely timed launch and capture clocks are applied to the system latches via the SGC circuits.

LBIST is used on the tester during manufacturing test and during system self-test. During manufacturing test, the tester applies necessary signals to scan the shift-register chains, cycle the PRPG 22 and MISR 23, and applies system clocks at the proper time. In the system, there are no available resources external to the chip to control the LBIST circuitry on the DUT 10. These controls are generated on-chip by an STCM which executes the LBIST test sequence in a stand-alone manner. In fact, an entire self-test sequence of the entire system can be initiated at a customer office via modem/service processor controller. LBIST design implementation Several unique features were required in the logic implementation to support the various aspects of the LBIST methodology.

FIG. 5 is a block diagram illustrating a prior art type of on-chip testing structure 100 with an, LSSD scan chain configuration of FIG. 1, further illustrating the associated combinational logic employing LBIST testing which is shown in commonly assigned Huott et al. U.S. Pat. No. 6,314,540; Koprowski et al. U.S. Pat. No. 6,327,685; and Motika et al. U.S. Pat. No. 6,968,489. FIG. 5 is a block diagram illustrating a prior art type of SRL chain based, integrated circuit device, such as DUT 10, with an LBIST engine 265 adapted for self testing of the integrated circuit. FIG. 5 is a block diagram illustrating a prior art type of SRL chain based, integrated circuit 100 LBIST implementation which is operated by an LBIST engine 265 which provides an output to parts of the integrated circuit 100 on control line 270.

The integrated circuit 100 includes among other features an LFSR 205 (serving as a PRPG which is 61 bits long), a set of n serially coupled latch chains 210A through 210N including a Boundary Scan (BS) latch chain 210A, Self Test Control Macro (STCM) latch chain 210B, and SRL chains 210C through 210N and the MISR 23. The MISR 215 is also 61 bits long and has a feedback configuration similar to that of the LFSR 205 which serves as a PRPG. The SRL chain 210A is the first of several SRL chains with the SRL chain 210N being the last SRL chain. Inputs of data to each latch chain 210A through 210N are supplied by the output of a corresponding multiplexer 220A through 220N. The multi-bit LFSR 205 has a single serial output on line L0 which is passed via bit "0" line L0 to an input of an M1 multiplexer 220A which applies an input to the appropriate STUMPS channel comprising a Boundary Scan (BS) latch chain 210A.

The LFSR 205 also has "n" parallel outputs connected to inputs of each of the "n" multiplexers 220A, 220B, 220C, 220D, ... 220N, each of which receives a corresponding input from Shift Register Inputs (SRI) L1, L2, L3 L4, ... Ln of a set of "n" input lines 225. A first input of each multiplexer 220A through 220N is coupled to a different one of the SRI lines 225. The SRI lines 225 are supplied from an external device storing various test vectors. A second input of each multiplexer 220A through 220N is coupled to a different of several parallel outputs from the LFSR 205. A third input of each multiplexer 220A through 220N is coupled to an output of the last SRL of the prior SRL latch chains 210A, 210B, 210C, 210D ..., except that the third input of the first multiplexer 220A is coupled to a still further output of the LFSR 205.

The "n" Shift Register Input lines (SRIs) L1, L2, L3, L4, ... Ln are connected to the respective multiplexers 220-220N. The SRI line L1 to the first input of multiplexer 220A is coupled to the only input of the LFSR 205.

A Pseudo Random "Flat" Data set of signals is supplied by a Phase Locked Loop (PLL) 260, which sends inputs to an On Product Clock Generation (OPCG) circuit 255 which provides clock outputs on line 250. Each test cycle, in addition to loading and unloading of chains 210A through 210N, requires timed application of system clock signals 250 from the OPCG 255 (i.e. clocks A, B and C described supra) to launch the test vector from the SRLs in sending SRL chains through the combinational logic and to capture the resulting response in corresponding SRLs in the receiving SRL chain. The PLL 260 generates a frequency signal used by the OPCG 255 which generates system clock signals on lines 250.

The output of the BS latch chain 210A is supplied to a parallel input to the MISR 215, to an input of the Mx multiplexer 240A, and to the M2 multiplexer 220B to be applied thereby to the input of the STCM latch chain 210B. The output of the STCM latch chain 210A is supplied to another input of the MISR 215 and to an input of the M2 multiplexer 220B to be applied thereby to the input of the SRL chain 210C. The output of the SRL chain 210C is supplied to another input of the MISR 215 and to an input of the M3 multiplexer 220C to be applied thereby to the input of the SRL chain 210C. The output of the SRL chain 210D is supplied to another input of the MISR 215 and the output thereof is shown for convenience of illustration without a connection for convenience of illustration.

The input of Mn multiplexer 220N is connected to the output of a previous SRL chain which is also not shown for convenience of illustration. The output of the Mn multiplexer 220N is applied to the input of the SRL chain 210N. The output of the SRL chain 210N is supplied to another input of the MISR 215 and to a final parallel input of the Mx multiplexer 240A. The output of Mx multiplexer 240A is connected to a serial input to the bottom of the MISR 215 and to the input of the MO multiplexer 240B which also receives an input from the output of the MISR 215, with the MO multiplexer 240B providing a Signature Register Output (SRO) on line 245.

The primary purpose of the STCM in FIG. 5 is to control the on-chip LBIST test operation; however, it also functions as the main interface and controller for all other test functions, with the exception of ABIST execution, which has its own independent test engine. The functions of the STCM 210B are as follows: 1) LBIST scan-clock generation and sequence controls; 2) Scan-chain configuration controls; and 3) external clock controls.

The output of each of the latch chains 210A through 210N is further coupled to a different input of the MISR 215. The outputs of the first SRL chain 210A and last SRL chain 210N are coupled to corresponding inputs of a multiplexer 240A. The output of multiplexer 240A is coupled to a serial input of the MISR 215 as well as to a first input of multiplexer 240B. A serial output of MISR 215 is coupled to a second input of the multiplexer 240B. The output of the multiplexer 240B is coupled to the SRO line 245.

The LFSR 205 serves as a PRPG that loads the test vector to be applied to the combinational logic (see FIG. 2) through the latch chains 210A through 210N. The MISR 215 generates a signature on the SRO line 245 representing the response of the combinational logic to the test vector. The MISR 215 effectively compresses the output of the chains 210A through 210N. Ideally, the signature for a specific failing gate in the combinational logic is different from the signature of the same gate not failing, after a predetermined number of test cycles. A test cycle is defined as the serial replacement of data stored in every SRL of an SRL chain followed by a clocking sequence and requires as many SRL load/unload cycles as there are SRLs in the longest SRL chains.

In an SRL chain each load/unload cycle shifts data from a preceding SRL into an immediately following SRL. A test pattern has as many data bits as there are SRLs in all SRL chains. The plurality of SRIs 225 and multiplexers 220A through 220N allow additional adjustment of the test vectors applied to SRL chains 210A through 210N.

Since the type of combinational logic shown in FIG. 2 may require several different clocks and since thorough testing may require testing various path delays through the combinational logic, the LBIST controller 265 of FIG. 5 generates various control signals on line(s) 270 that control, for example, multiplexers 220A through 220N, and multiplexers 240A and 240B in response to inputs from the OPCG 255 that as stated above is responsive to the PLL 260. A test interval may require relatively large numbers of test cycles after which the contents of the MISR 215 (i.e. the MISR signature) are read through SRO output line 245 and compared to an expected signature. A test interval is defined as a number of test cycles followed by a signature unload sequence. Note that normal operation of integrated circuit 100 is not changed by the present invention. Integrated circuit 100 selectively and dynamically gates movement of data (contents of individual SRLs) from latch chains 210A through 210N into MISR 215.

The first signature dimension (test pattern cycle control) can be controlled by gating data input to the MISR 215 active only for a specified group of test patterns. This may encompass all test patterns loaded and unloaded before or after a predefined a number of test cycles or within a range of test cycles. The second signature dimension (SRL chain to MISR input selection) can be controlled by gating a specific SRL chain onto the corresponding MISR 215 input which is active. The complement of this condition is may be invoked, i.e. gating all but a specific active SRL. The third signature dimension (SRL chain load/unload shift count) can be controlled by gating MISR input active only for a specified range of SRL chain load/unload cycles that is determined by selectable and definable start and stop counts. The complement of this condition may also be invoked, i.e. gating MISR input active for all but a specified range of SRL chain load/unload cycles.

In addition to each single signature dimension, two or three-dimensional signatures can be generated by combining conditions on any two or all three signature dimensions simultaneously. Applying the method illustrated in FIG. 8 and described infra to integrated circuit 100 allows quick and certain identification of the failing portion of the latch chains 210A through 210N as well as the patterns causing the fails. Examples include: (1) identification of a sub-set of a test vector, (2) individual fail patterns (i.e. stuck-at), (3) failing SRL chains, (4) failing groups of SRLs in a particular SRL chain and (5) individual failing latch(es).

SUMMARY OF THE INVENTION

System and computer program products corresponding to the above-summarized methods are also described and claimed herein.

The present invention involves use of the JTAG functional test patterns and exercisors to solve the problem of diagnosing broken scan chains in either a serial or a lateral broadside insertion manner across all latch system ports and to analyze the response data efficiently for the purpose of readily identifying switching and non-switching latches with the next to last non-switching latch being the point of the break within a defective scan chain(s). This comprehensive latch perturbation, in conjunction with iterative diagnostic algorithms is used to identify and to pinpoint the defective location in such a broken scan chain(s). This JTAG Functional test function and the JTAG test patterns ultimately derived therefrom, can take on different forms and origins, some external to a product and some internal to a product.

An advantage of the present invention is that no test pattern generation is required. There is the capability of executing existing JTAG LBIST (Logic Built In Self Test) patterns. Flexibility exists to execute multiple JTAG LBIST clock sequences, i.e., 1g, 2g, 3g, 4g, 5g, 6g, 7g functional clocks. There is flexibility to execute multiple JTAG LBIST signature intervals; and to generate MISR signatures for all chains dynamically at the test system.

The present invention is highly effective when diagnosing un-modeled faults, AC defects, and intermittent fails that do not conform to the classical or conventional stuck-at or transitional fault models. Also, many of the underlying basic concepts can be generalized and integrated into general-purpose automated test generation and diagnostic products.

In accordance with this invention, a method is provided for determining the location of a failure in a scan chain comprising the following testing steps. (a) start; (b) select a Joint Test Action Group (JTAG) Logic Built-In Self-Test (LBIST) test pattern set; (c) run the selected JTAG LBIST test pattern set through scan chains with various functional clock sequences; (d) unload the scan chains and store fail data therefrom into a file; (e) examine the fail data to find a last switching latch location; (f) perform comparison of the last switching latch location with a previous last switching location in a previous run and if results of the comparison are consistent then end the testing steps as the location of the failure has been identified; but if results of the comparison are inconsistent, then repeat steps (b)-(f) to collect more fail data until consistent results are obtained. Preferably, the various functional clock sequences are selected from the group consisting of 1g, 2g, 3g, 4g, 5g, 6g, 7g clocks; Physical Failure Analysis (PFA) initiated after step (f); a determination is made as to which is a last switching latch in the scan chain. The comparison in step (f) is made between ultimate fail results and penultimate fail results. In step (f) a comparison is made between ultimate fail results and penultimate fail results.

In accordance with another aspect of this invention, a method is provided for of detecting a defect in a scan chain, the method by the following steps. (a) start; (b) apply a plurality of test pattern sets to a scan chain using an Joint Test Action Group (JTAG) Logic Built-In Self-Test (LBIST) circuit coupled to the scan chain; c) collect scan fail data generated by the scan chain as a result of the application of the plurality of pattern sets to the scan chain; (d) store the scan fail data into a file; (e) examine the fail data to find a last switching latch location to determine which is a last switching latch in the scan chain; and (f) use the collected scan fail data to identify a defective latch in the scan chain. Preferably, determine which is a last switching latch in the scan chain; perform the comparison in step (f) between the ultimate fail results and penultimate fail results; the various functional clock sequences are selected from the group consisting of 1g, 2g, 3g, 4g, 5g, 6g, 7g clocks; and initiating Physical Failure Analysis (PFA) after step (f).

In accordance with another aspect of this invention an apparatus, comprises a memory and program code resident in the memory configured to detect a defect in a scan chain disposed in an integrated circuit device by collecting scan fail data from said scan chain, generated as a result of an application of a plurality of pattern sets with various functional clock sequences to the scan chain by a Joint Test Action Group (JTAG) Logic Built in Self Test (LBIST) circuit disposed in the integrated circuit device, and using collected scan fail data to make a comparison of scan fail data to identify a defective latch in the scan chain.

Preferably, the apparatus selects the various functional clock sequences from the group consisting of 1g, 2g, 3g, 4g, 5g, 6g, 7g clocks; determines which is a last switching latch in the scan chain; and compares ultimate fail results and penultimate fail results. The apparatus determines which is a last switching latch in the scan chain; the apparatus initiates Physical Failure Analysis (PFA) ultimately. The apparatus determines which is a last switching latch in the scan chain. The apparatus compares ultimate fail results and penultimate fail results and if results of the comparison are consistent determining the location of the fail; and the apparatus initiating Physical Failure Analysis (PFA) subsequently.

A program product, comprising program code configured to detect a defect in a scan chain disposed in an integrated circuit device by collecting from the scan chain, scan fail data generated as a result of an application of a plurality of pattern sets with various functional clock sequences to the scan chain by a Joint Test Action Group (JTAG) Logic Built in Self Test (LBIST) circuit disposed in the integrated circuit device, using collected scan fail data to identify a defective latch in the scan chain; and a computer readable signal bearing medium bearing the program code.

Preferably the program product selects various functional clock sequences from the group consisting of 1g, 2g, 3g, 4g, 5g, 6g, 7g clocks; the program product determines which is a last switching latch in the scan chain. the program product compares ultimate fail results and penultimate fail results and if results of the comparison are consistent determining the location of the fail; and the program product initiates Physical Failure Analysis (PFA) subsequently.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

FIG. 6. is a chart showing an example of four testing runs.

Figure 1:
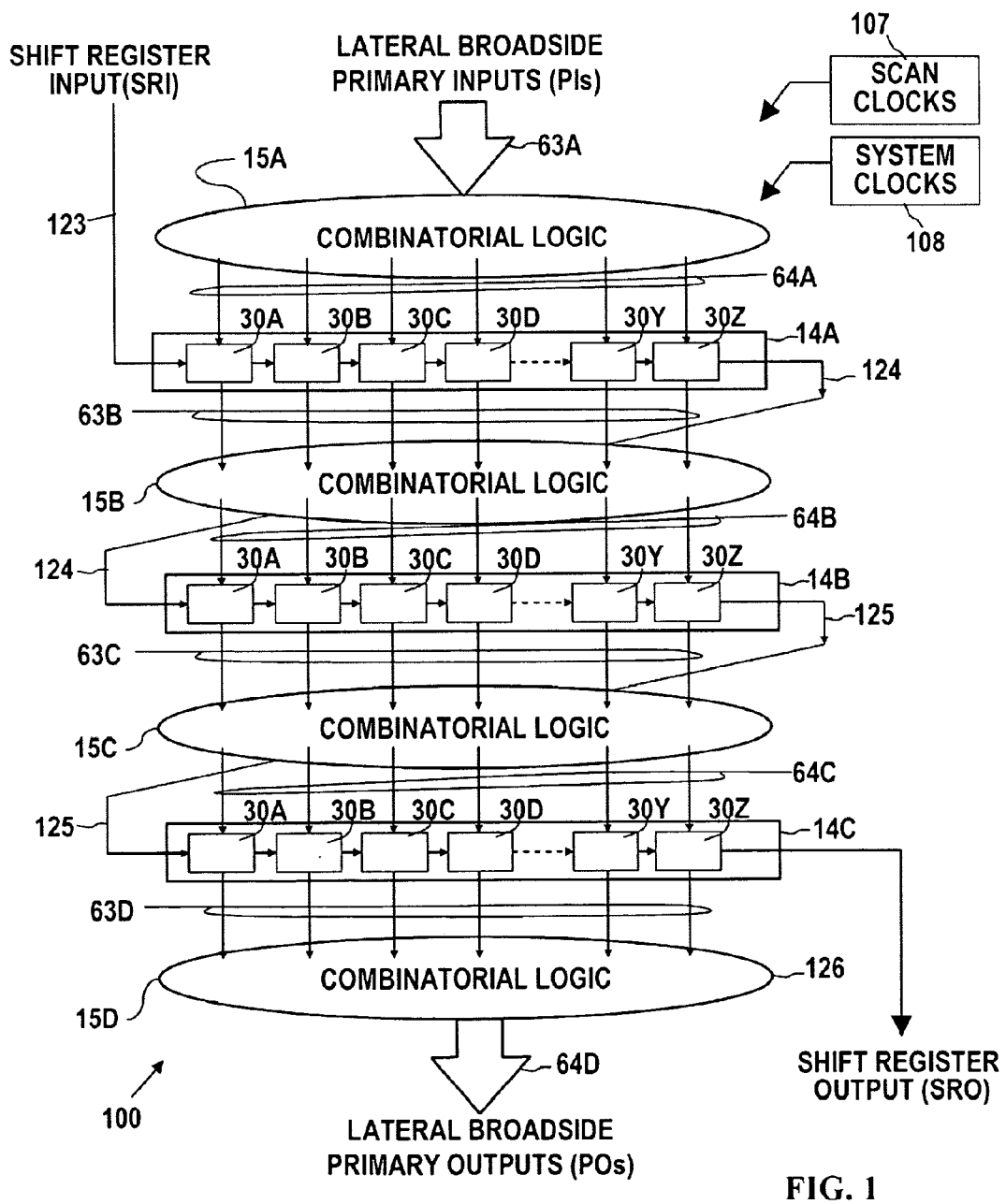
FIG. 1 is a block diagram showing a typical prior art Level Sensitive Scan Design (LSSD) circuit incorporating a boundary scan architecture.
Figure 2A:
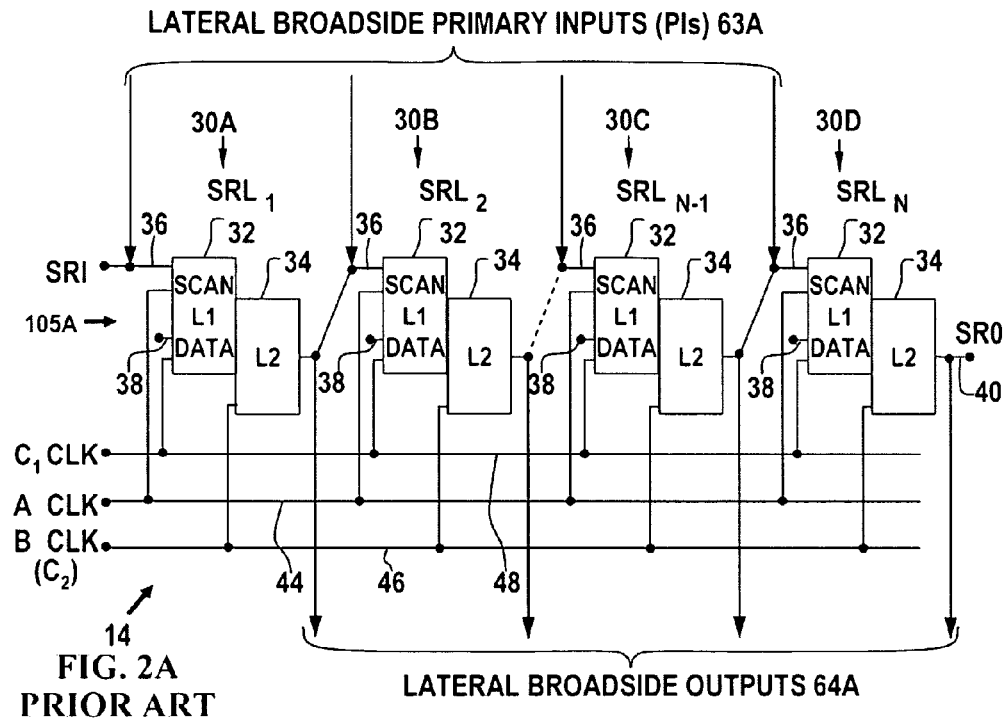
FIG. 2A is a schematic diagram showing a typical prior art type of circuit used in testing comprising a LSSD scan chain circuit configuration.
Figure 2B:
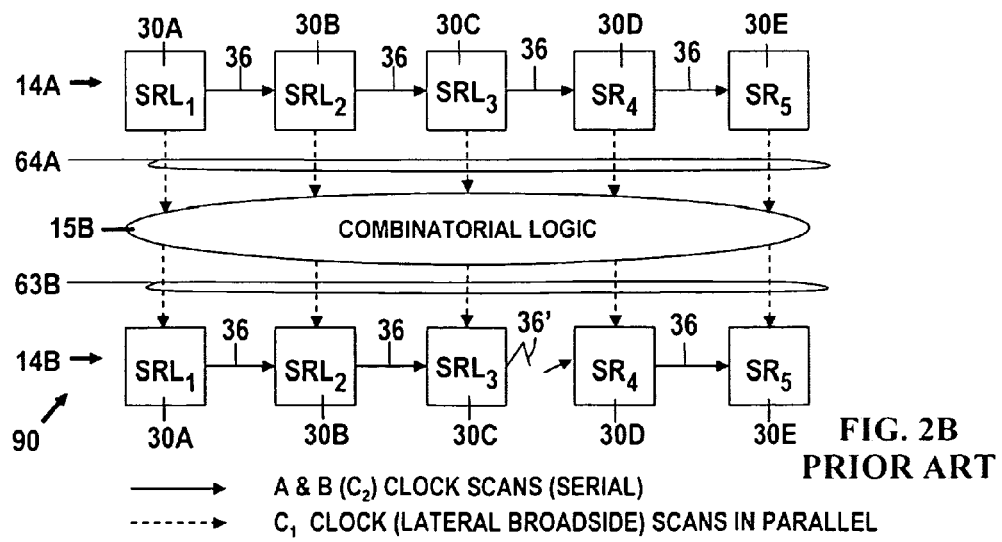
FIG. 2B shows a prior art circuit including an SRL which is a first stage of five SRLs connected in series as in FIG. 2A.
Figure 3:
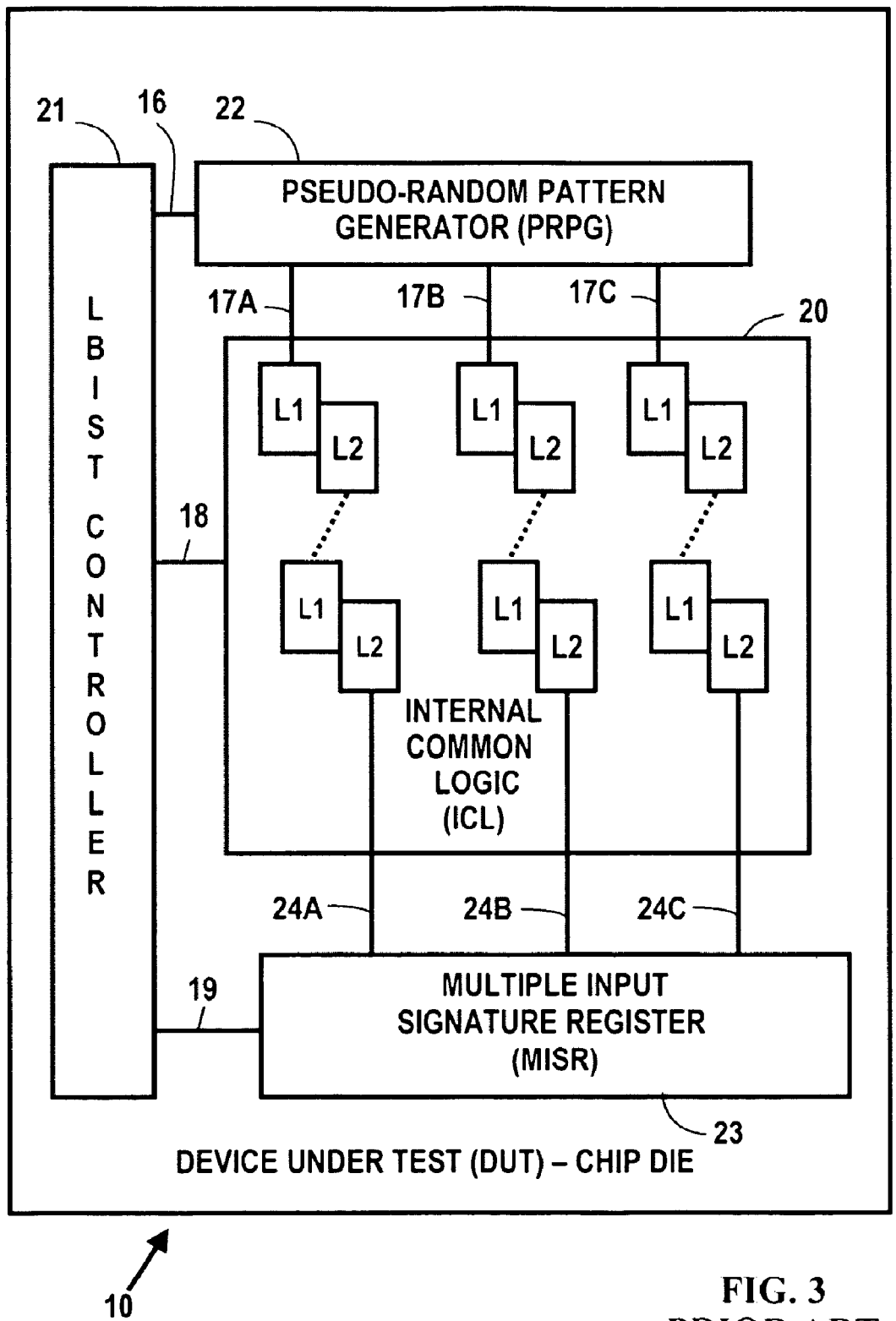
FIG. 3 is a block diagram which illustrates the main components of the prior art LBIST method which allows for discovery of defects in a DUT, e.g. a semiconductor chip die.
Figure 4:
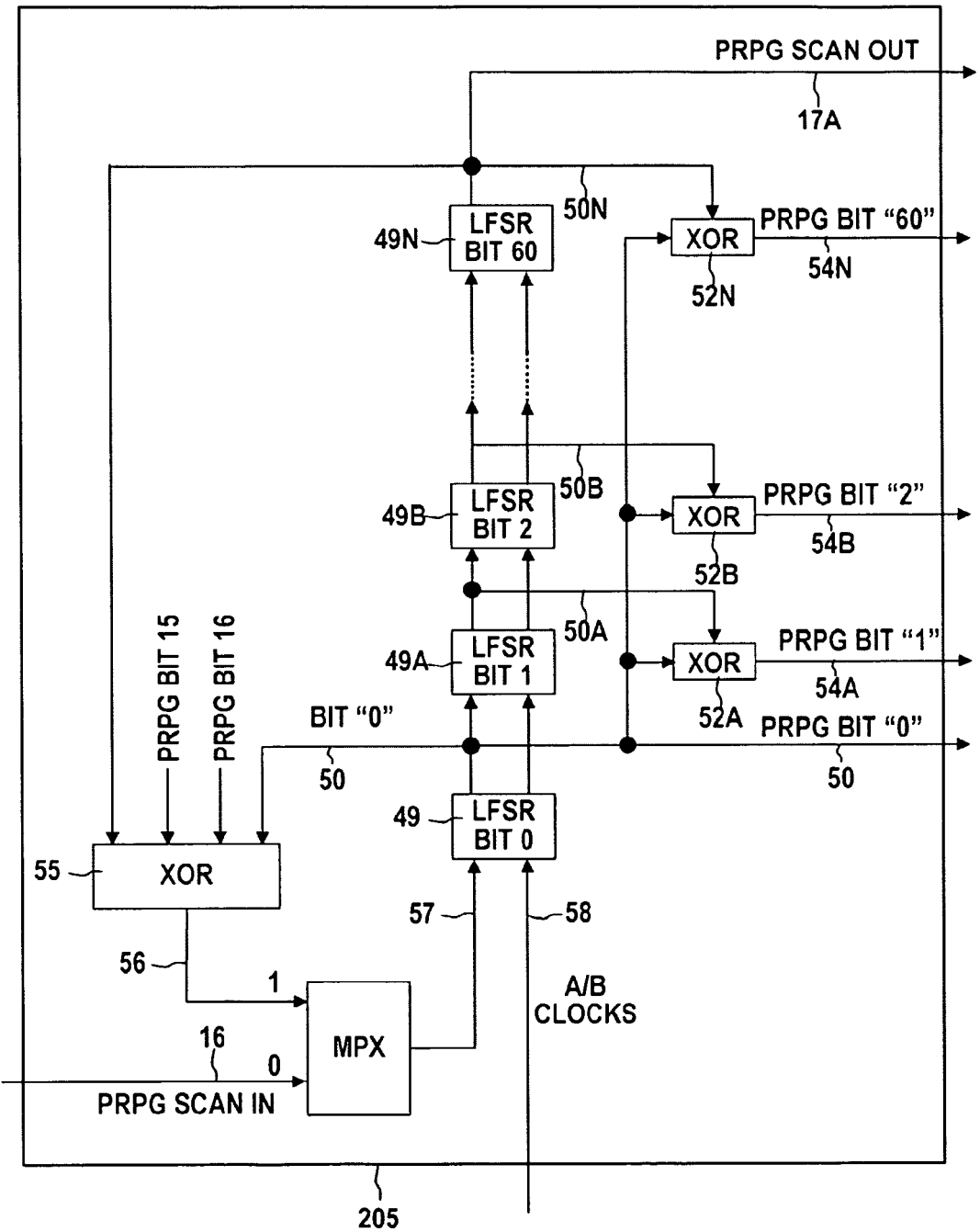
FIG. 4 is a circuit diagram of a prior art example of LBIST architecture in which a PRPG which comprises a LFSR provided with an input from an LBIST Controller with a feedback configuration.
Figure 5:
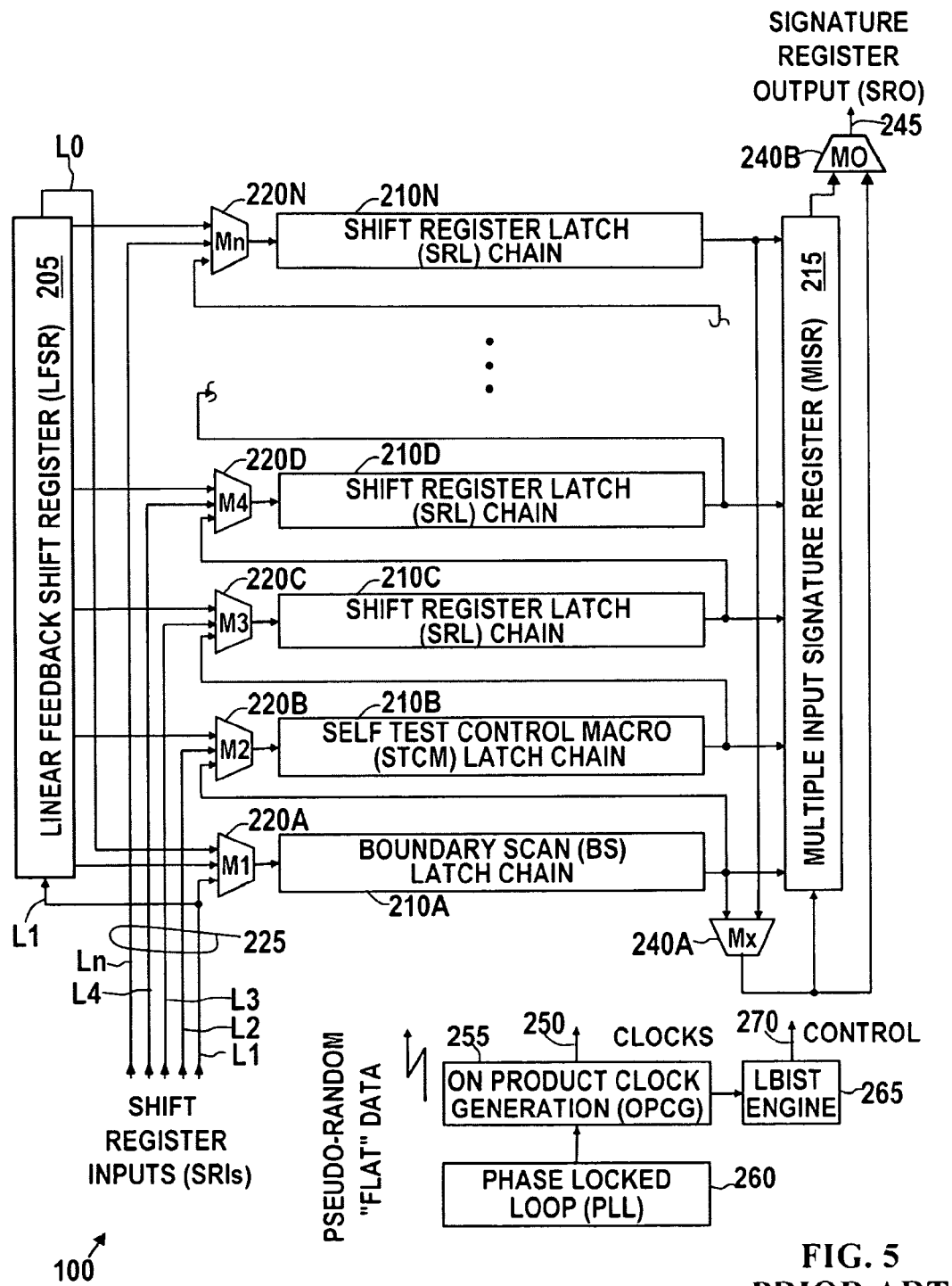
FIG. 5 is a block diagram illustrating a prior art type of on-chip testing structure employing LBIST testing.

The subject matter that is regarded as the invention is particularly pointed out and distinctly claimed in the claims at the conclusion of the specification. The foregoing and other objects, features, and advantages of the invention are apparent from the following detailed description taken with the accompanying drawings in that the detailed description explains the preferred embodiments of the invention, together with advantages and features, by way of example with reference to the drawings.

DETAILED DESCRIPTION OF THE PREFERRED EMBODIMENT

The present invention uses the JTAG functional test function/exercisor in a serial or a lateral broadside insertion manner across all latch system ports and to perform an efficient analysis of the response data so that switching and non-switching latches are readily identified with the next to last non-switching latch being the point of the break within the defective scan chain(s). This comprehensive latch perturbation, in conjunction with iterative diagnostic algorithms is used to identify and to pinpoint the location of a defective latch in each of the broken scan chain(s). This JTAG Functional test function and the JTAG test patterns ultimately derived therefrom, can take on different forms and can have different origins, some external to a product and some internal to a product. No test pattern generation is required.

JTAG pattern set(s) and functions are exercised as outlined above to generate broken scan chain diagnostic patterns. For example, upon loading the scan chain(s) it is clear to see that a stuck-at-1 fault causes the remainder of the associated scan chain(s) to be stuck-at-1 also. Upon pulsing the system $C_1$ and $C_2$ clocks, system data will be clocked in broadside via the system ports of the latches within the scan chain(s) in JTAG functional mode. Subsequently, the scan chain(s) are then unloaded and the scan chain internal states are analyzed by tester resident software that identifies the latch at which the JTAG LBIST random data stops and the stuck-at-0 or stuck-at-1 data begin. This unload data can also be compared against unload data of a good known reference device, if available, but is not necessary.

Comparing expected results from a good reference device with the bad device will help narrow down or localize where the fault occurs and thus, will greatly improve the accuracy of the diagnostic call. In addition, executing a large number of JTAG LBIST test patterns across unique clocking sequences or base pattern sets will also provide improved diagnostic granularity. The exact number of JTAG patterns to be applied can also be arrived at empirically on a design-by-design basis. The more JTAG test patterns applied resulting in the last switching latch to be reported as common mode will give even greater confidence of the diagnostic call. This method and process is sufficient to sensitize, capture, and ultimately observe the defect.

Scan chain breaks can be especially difficult to isolate because the stuck value will fill the entire chain when attempting to initialize a chip. The power-on stability state of latches can often be the same as the stuck value, so a simple power-on and scan out may often fail to identify the break correctly. Usually, functional clocks must be issued in an attempt to load the latches after the break with random data. Then a scan out will show random data up to the scan break. Simply issuing one clock with one pattern is usually insufficient; because it often occurs that after the scan break the latches have logic dependencies on other latches.

For the right situation, this could cause latches directly after a break to only load the stuck value even though they are after the break. This creates the appearance that the break happened farther down the chain than it really did. In this case, LBIST is especially useful, because many different patterns can be run with more than one functional clock.

This increases the possibility of finding a pattern that will cause the latches to be loaded (directly after a break) with random data to isolate the fail correctly. By collecting scan out data from many different LBIST patterns, the latch furthest back in the chain that has the same data across all the patterns can be identified. Upon verifying that it is possible for that latch to be loaded with a value other than the stuck value with LBIST, one can be confident that the location of the break has been isolated correctly.

This embodiment above coupled with the ability of JTAG to apply a plurality of LBIST tests, as outlined above, in functional test mode provides a very powerful diagnostic tool in the realm of broken scan chain diagnostics.

Today, with increasing VLSI densities and the number of latches surpassing 2 million on a single device, it is critical and essential to have said diagnostic tools for the successful diagnosis of broken scan chains. Therefore, this method and process of JTAG Based LBIST to identify and pinpoint latches causing broken scan chains is superior to all other known solutions. In addition, the problem with using straight logic deterministic patterns is that because the break can potentially be so early in the longest scan chain, the bulk of the ring simply gets the stuck value. LBIST actually loads PRPG data for each STUMPS Channel, instead of having to load through the entire ring so it easily loads data after the broken STUMPS Channel.

Procedures

To run LBIST, program the LBIST controller as desired and starts it using JTAG. Once LBIST finishes, can scan out test data with JTAG. The latches of the chip are grouped into scan STUMPS of a maximum size. For LBIST, Pseudo-random data from the PRPG's is scanned into the STUMPS. After the STUMPS are loaded with the PRPG data a number of functional clocks are issued, which captures the logic evaluation of the PRPG pattern. Then the process repeats.

With LBIST one hopes that a PRPG pattern will set up the logic so that when the functional clocks are issued one loads latches after the scan break with nice random looking data. Then when one scans the data out hoping to see something like the Example in the row (A) of FIG. 6 For the example in row (A) the break seems to cause a stuck at "0" condition in the scan chain, and one could guess that the break is after the last "0" and before the first "1". However, it could be that the PRPG pattern simply caused a "0" to be loaded into some latches after the break, so the program must be run as many patterns as possible trying to located a "1" earlier in the chain.

FIG. 6. is a chart showing an example of four runs 1-4 is shown by the test data in rows (B)-(E) The third ring dump in row in row (D) shows the earliest 1, so it is assumed that the latch corresponding to that location in the chain is the location of the break.

When scanning the DUT (chip) to read or write data from the JTAG the STUMPS are concatenated together into larger "rings" that are read/written. So if we were to scan in random data via JTAG all of the STUMPS after the STUMP containing the break would only get the stuck value, and we could be less likely to be able to load in random data after the break with functional clocks.

Figure 7:
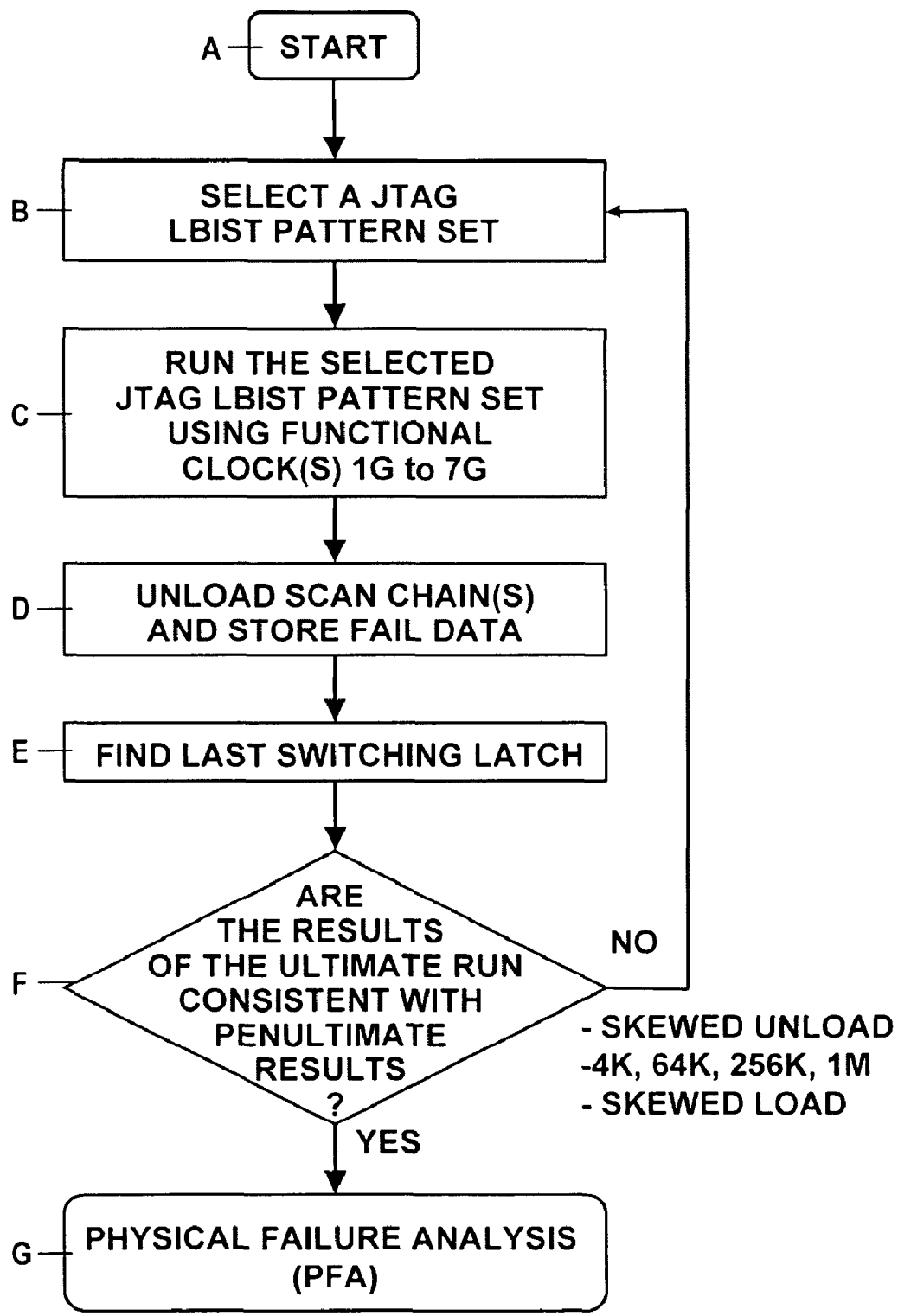
FIG. 7 shows a flow chart of the steps performed by the JTAG LBIST testing in accordance with this invention.

FIG. 7 shows a flow chart of the steps performed by the JTAG LBIST testing in accordance with this invention.

Step A START In step A, start the program.

In step B, select a JTAG LBIST pattern set. This is a self-contained and exhaustive diagnostic test pattern suite. This JTAG test pattern suite consists of numerous LBIST tests, ranging from various clock sequences (1g, 2g, 3g, 4g, 5g, 6g, 7g) i.e. different flavors, and different load/unload(s) (skewed unload, skewed load) to higher loop count signature intervals (4 k, 64 k, 256 k, 1 M tester loops) in a functional/system type mode.

In step C, run selected JTAG LBIST pattern set using different flavors of LBIST (where the flavors comprise functional clock(s) 1G to 7G, 1K or 4K Loops, etc.) After a number of functional clocks are issued, the JTAG LBIST pattern set captures the logic values by laterally inserting broadside random values across all latch system ports. The objective is to introduce a pattern that will set up the logic so that when the functional clocks are issued the latches are loaded after the scan break with input data which appears to be random.

In step D, unload scan chain(s) and store the scan output fail data produced by the scan chains into a file. First perform the Unload Scan Operation by pulsing the A and B clocks for the length of the shift register chain(s); i.e. for a ten bit shift register, produce ten pulses, etc. Then, collect the fail data on the output of the shift register. Finally, store the fail data in a data file.

In step E, compare the collected fail data in the file to the expected results from a good reference device or a good operating region to assess the location of the last switching latch. Software to identify where a break occurs recognizes where random data no longer starts to appear. A string of all binary zeroes or all binary ones after a string of random data is the most likely location of the break.

In Step F a test is made to determine whether the results obtained are consistent, i.e. the same as the fail data stored in the file previously, i.e. the most recent results of said comparison are consistent with penultimate results of said comparison. If NO, then repeat step B t.; proceed in a recursive mode of operation, by returning to step B select another JTAG LBIST pattern set and collect more data repeating the sequence to collect more fail data until Step F yields ultimate data results consistent results with penultimate results of said comparison. If YES, i.e. ultimate results of the comparison are consistent being identical to penultimate results of said comparison, then end said testing step proceed to step G which performs Physical Failure Analysis (PFA).

The technique described herein has been tested successfully on leading edge technology products.

To sum up. LBIST is advantageous for finding scan breaks because a lot of pseudo random patterns are determined with PRPG, and the random data can be loaded into STUMPS after the scan break.

The procedure of initialization and setup of the stability of a chip puts the chip (DUT) into the JTAG stability state. It executes the JTAG (LBIST) script for a specific loop count, e.g. 4K, 100K, 256 k, 1 M; and executes the JTAG LBIST script using different functional clocks; and generates the signature for every scan chain.

The solution of the present invention has the advantage that it provides an efficient and unique solution to the stuck-at or broken scan chain diagnostics within a Final Wafer Test environment. The benefits provided included rapid on-the-fly diagnosis; pinpointing defective latches with a high probability; compatibility with existing non-BIST designs Application Specific Integrated Circuits (ASICs); compatibility with existing structural LSSD, and BIST designs; elimination of extensive test result data collection; relatively simple implementation; easily simplified and automated for manufacturing testing; quick and direct path from test system to PFA (Physical Failure Analysis); extension to on-chip hardware implementation for use as a BIST support function and a DFD feature(s); and no required fault simulation.

Furthermore, this new approach is highly effective when diagnosing faults that have not been modeled, AC (Alternating Current) defects, and intermittent fails that do not conform to the classical or conventional stuck-at or transitional fault models. Also, many of the underlying basic concepts can be generalized and integrated into general-purpose automated test generation and diagnostic products.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

What is claimed is:

1. A method of determining the location of a failure in a scan chain comprising the testing steps as follows:
    (a) starting;
    (b) selecting an IEEE 1149.1 compatible Joint Test Action Group (JTAG) functional test function/exercisor Logic Built-In Self-Test (LBIST) test pattern set;
    (c) running the selected JTAG functional test function/exercisor LBIST test pattern set through scan chains with various different flavors of LBIST functional clock sequences in a serial or a lateral broadside insertion manner across all latch system ports;
    (d) unloading said scan chains and store fail data therefrom into a file;
    (e) examining said fail data to find a last switching latch location;
    (f) performing a comparison of said last switching latch location with data stored from a previous run or expected results from a good reference device or a good operating region; and if results of said comparison are consistent then ending said testing steps as said location of said failure has been identified; but if results of said comparison are inconsistent, then repeating steps (b)-(f) to collect more fail data until consistent results are obtained.

2. The method of claim 1 wherein said various functional clock sequences are selected from the group consisting of 1g, 2g, 3g, 4g, 5g, 6g, 7g clocks.

3. The method of claim 1 including initiating Physical Failure Analysis (PFA) after step (f).

4. The method of claim 1 including determining which is a last switching latch in a said scan chain.

5. The method of claim 1 wherein said comparison in step (f) is made between ultimate fail results and penultimate fail results.

6. The method of claim 5 including initiating Physical Failure Analysis (PFA) after step (f).

7. The method of claim 6 including determining which is a last switching latch in a said scan chain.

8. The method of claim 7 wherein said comparison in step (f) is made between ultimate fail results and penultimate fail results.

9. The method of detecting a defect in a scan chain, the method comprising:
    (a) starting;
    (b) applying a plurality of Logic Built-In Self-Test (LBIST) test pattern sets to a scan chain using an IEEE 1149.1 compatible Joint Test Action Group (JTAG)) functional test function/exercisor circuit coupled to said scan chain using LBIST flavors;
    (c) collecting scan fail data generated by said scan chain as a result of the application of the plurality of said pattern sets to said scan chain;
    (d) storing said scan fail data into a file;
    (e) examining said fail data to find a last switching latch location to determine which is a last switching latch in a said scan chain;
    (f) using the collected scan fail data to identify a defective latch in said scan chain.

10. The method of claim 9 including
    determining which is a last switching latch in a said scan chain;
    making said comparison in step (f) between ultimate fail results and penultimate fail results;
    selecting said various functional clock sequences from the group consisting of 1g, 2g, 3g, 4g, 5g, 6g, 7g clocks; and
    initiating Physical Failure Analysis (PFA) after step (f).

11. An apparatus, comprising:
    a memory and program code resident in the memory configured to detect a defect in a scan chain disposed in an integrated circuit device by collecting scan fail data from said scan chain, generated as a result of an application of a plurality of Logic Built in Self Test (LBIST) circuit pattern sets with various functional clock sequences to the scan chain by an IEEE 1149.1 compatible Joint Test Action Group (JTAG) functional test function/exercisor Logic Built in Self Test (LBIST) coupled to said scan chain using LBIST flavors, and
    said apparatus using collected scan fail data to make a comparison of scan fail data to identify a defective latch in the scan chain.

12. The apparatus of claim 11 wherein said various functional clock sequences are selected from the group consisting of 1g, 2g, 3g, 4g, 5g, 6g, 7g clocks.

13. The apparatus of claim 11 including determining which is a last switching latch in a said scan chain.

14. The apparatus of claim 11 wherein said comparison is made between ultimate fail results and penultimate fail results.

15. The apparatus of claim 14 including determining which is a last switching latch in a said scan chain.

16. The apparatus of claim 15 wherein said comparison is made between ultimate fail results and penultimate fail results.

17. The apparatus of claim 16 including initiating Physical Failure Analysis (PFA).

18. The apparatus of claim 11 wherein:
said apparatus selects various functional clock sequences from the group consisting of 1g, 2g, 3g, 4g, 5g, 6g, 7g clocks;
said apparatus determines which is a last switching latch in a said scan chain;
said apparatus compares ultimate fail results and penultimate fail results and if results of said comparison are consistent then determining the location of said fail; and
said apparatus initiating Physical Failure Analysis (PFA) subsequently.

19. A program product, comprising:
program code configured to detect a defect in a scan chain disposed in an integrated circuit device by collecting from said scan chain, scan fail data generated as a result of an application of a plurality of pattern sets with various functional clock sequences to the scan chain by an IEEE 1149.1 compatible Joint Test Action Group (JTAG) functional test function/exercisor Logic Built in Self Test (LBIST) circuit disposed in the integrated circuit device,
using collected scan fail data to identify a defective latch in the scan chain; and
a computer readable signal bearing non-transitory computer readable medium bearing the program code.

20. The program product of claim 19 wherein:
said program product selects various functional clock sequences from the group consisting of 1g, 2g, 3g, 4g, 5g, 6g, 7g clocks;
said program product determines which is a last switching latch in a said scan chain,
said program product compares ultimate fail results and penultimate fail results and if results of said comparison are consistent determining the location of said fail; and
said program product initiates Physical Failure Analysis (PFA) subsequently.

* * * * *